United States Patent
Kaminskii et al.

(10) Patent No.: US 8,963,263 B2
(45) Date of Patent: Feb. 24, 2015

(54) RESISTANT STRAIN GAUGE

(75) Inventors: Vladimir Vasil'evich Kaminskii, St. Petersburg (RU); Alexander Vasil'evich Golubkou, St. Petersburg (RU); Volodin Nikolay Mikhailovich, Himki (RU); Soloviev Sergey Mikhailovich, St. Petersburg (RU)

(73) Assignee: SmS tenzotherm GmbH, Dortmund (DE)

( * ) Notice: Subject to any disclaimer, the term of this patent is extended or adjusted under 35 U.S.C. 154(b) by 0 days.

(21) Appl. No.: 14/116,767

(22) PCT Filed: May 7, 2012

(86) PCT No.: PCT/EP2012/001948
§ 371 (c)(1),
(2), (4) Date: Jan. 3, 2014

(87) PCT Pub. No.: WO2012/152425
PCT Pub. Date: Nov. 15, 2012

(65) Prior Publication Data
US 2014/0103466 A1    Apr. 17, 2014

(30) Foreign Application Priority Data
May 10, 2011 (RU) ................................ 2011118769

(51) Int. Cl.
*G01P 15/08* (2006.01)
*H01L 21/00* (2006.01)
*G01L 1/22* (2006.01)
*G01B 7/16* (2006.01)
*H01L 41/047* (2006.01)

(52) U.S. Cl.
CPC ........... *G01L 1/2293* (2013.01); *H01L 41/0474* (2013.01); *G01B 7/18* (2013.01)

USPC .............................................. 257/417; 438/50

(58) Field of Classification Search
CPC ...... G01L 1/2293; G01B 7/18; H01L 41/0474
USPC .............................................. 257/417; 438/50
See application file for complete search history.

(56) References Cited

U.S. PATENT DOCUMENTS

| 4,236,156 A * | 11/1980 | Eden ............................ 345/106 |
| 5,225,126 A | 7/1993 | Alles |
| 6,647,797 B2 * | 11/2003 | Miodushevsky ................ 73/774 |
| 2003/0061884 A1 | 4/2003 | Mioduschevsky |

FOREIGN PATENT DOCUMENTS

SU    1717946 B    3/1992

* cited by examiner

*Primary Examiner* — William D Coleman
(74) *Attorney, Agent, or Firm* — Andrew Wilford

(57) ABSTRACT

The invention relates to measurement and control of mechanical values, in particular, to control of stress conditions of various structures and manufacturing sensors of resistant strain gauge type for measuring various mechanical values. It can be used in manufacturing sensors of deformation, force, pressure, movement, vibration etc. to increase accuracy in resistant strain gauge measuring at sensitivity preservation. The resistant strain gauge for deformation and pressure measuring represents a dielectric substrate with spread strain-sensing layer in state of polycrystalline film, which contains samarium sulfide, and metal contact pads. Pads are placed on the same side of a film and output signals are soldered to them. Strain-sensing layer comprises holes which connect the pads. According to the first option, strain-sensing layer has the following composition $Sm_{1-x}Ln_xS$, where Ln is one from the elements: La, Ce, Pr, Nd, Gd, Tb, Dy, Ho, Er, Tm, Lu, Y, at $0<x<0.3$. According to the second option, strain-sensing layer has the following composition $Sm_{1+z}S$, where $0<z<0.17$.

4 Claims, 1 Drawing Sheet

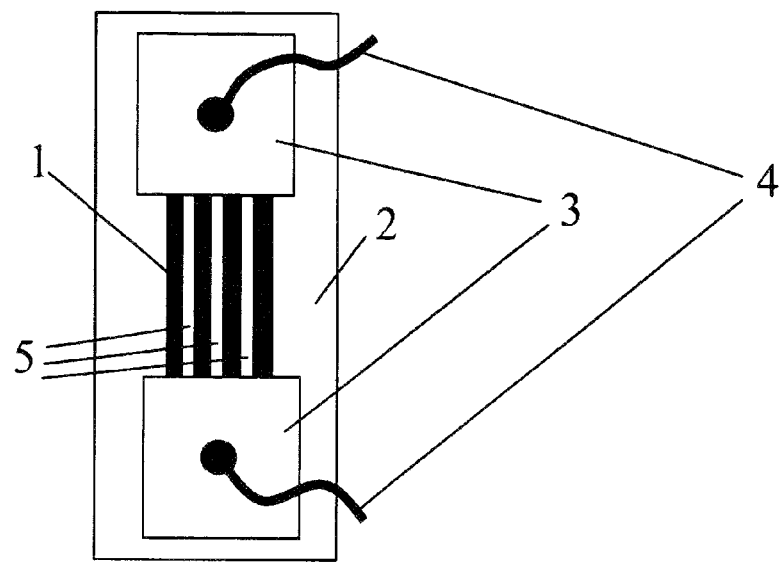

RESISTANT STRAIN GAUGE

CROSS REFERENCE TO RELATED APPLICATIONS

This application is the US-national stage of PCT application PCT/EP2012/001948 filed 7 May 2012 and claiming the priority of Russian patent application 2011118769 itself filed 10 May 2011.

FIELD OF THE INVENTION

The invention relates to measurement and control of mechanical sizes, in particular, to control of stress conditions of various structures. The invention furthermore relates to the manufacturing of sensors, in particular of resistant strain gauge type for measuring various mechanical values. The invention can be used in manufacturing sensors of deformation and/or force and/or pressure and/or movement and/or vibration etc.

BACKGROUND OF THE INVENTION

Problems of measuring mechanical quantities in technical objects occur rather often. This happens both at the stage of various machines design, mechanisms, structures, vehicles etc., and in their operation. Very often these problems are solved by applying the methods and means of strain gauging, where the main measuring device is a resistant strain gauge.

The main disadvantages of existent resistant strain gauges are their low gauge factor, the dependence of the output signal from the temperature which is characterized by the temperature coefficient of resistance that leads to a decrease in accuracy. The gauge factor K is defined as the ratio of the relative change in electrical resistance of resistant strain gauge $\Delta R/R$ to the value of relative deformation $\in$, $K=(\Delta R/R)/\in$. Temperature coefficient of resistance $\alpha$ (TCR) is defined as the relative change in electrical resistance of resistant strain gauge at temperature change by one degree, $\alpha=(\Delta R/R)/\Delta T$.

A resistant strain gauge for measurement of deformations and pressure in which the strain-sensing element is executed on the basis of a thin polycrystalline film of samarium sulfide—the SmS is known (V. V. Kaminskii, I. A. Smirnov Rare-earth semiconductors in mechanical quantities' sensors. Devices and control systems 1985, Vol. 8, pp. 22-24). It has high gauge factor and good linearity of the output characteristics in the climatic temperature range. Its construction represents a dielectric substrate on which the strain-sensing layer from SmS and metal contact pads are placed and to which output wires are soldered. If the substrate deforms the SmS layer also deforms, having an electrical resistance in direct proportion to the deformation. This change in electrical resistance is fixed by electronic equipment.

The main disadvantage of this resistant strain gauge is a significant change in the relative electrical resistance $\Delta R/R$ under the influence of temperature, so that the temperature coefficient of resistance $\alpha$ in the climatic temperature range varies from $(-2\times10^{-3}$ deg$^{-1})$ to $(-4\times10^{-3}$ deg$^{-1})$, which leads to an increase in measurement error.

A resistant strain gauge for measurement of deformations and pressure on the basis of a polycrystalline SmS thin film (author's certificate SU no. 1717946, G01B7/16, G01B7/18), which is placed on a dielectric substrate, is taken as a prototype of the suggested resistant strain gauge and its versions. Metal contact pads with soldered output wires are connected to the film. The resistant strain gauge has a high gauge factor $K=40$; temperature coefficient of resistance (TCR) is $\alpha=-2\times10^{-3}$ deg$^{-1}$.

Its disadvantage is a large value of temperature coefficient of resistance (TCR), which leads to measurement errors and reduced accuracy.

OBJECT OF THE INVENTION

The object of the invention is to solve the problem of increase of resistor strain gauge measurements' accuracy at sensitivity preservation.

SUMMARY OF THE INVENTION

According to the first variant, the problem is solved by the resistant strain gauge for measuring deformations and pressure that comprises a dielectric substrate with a strain-sensing layer as a polycrystalline film, which contains samarium sulfide, and metal contact pads. The contact pads are placed in a distance to each other on the same surface of a film with soldered output wires to them. According to the invention the strain-sensing layer has openings, which are extending between the contact pads. The layer has the following formula $Sm_{1-x}Ln_xS$, where Ln is one the elements: La, Ce, Pr, Nd, Gd, Tb, Dy, Ho, Er, Tm, Lu, Y, and $0<x<0.3$.

According to the second variant, the problem is solved by the resistant strain gauge for measuring deformations and pressure that includes a dielectric substrate with a strain-sensing layer as a polycrystalline film, which contains samarium sulfide, and metal contact pads. The contact pads are placed in a distance to each other on the same surface of a film with soldered output wires to them. According to the invention the strain-sensing layer has openings, which are extending between the contact pads. The layer has the following formula $Sm_{1+z}S$, where $0<z\leq0.17$.

According to the first option, instead of SmS a layer of solid solution $Sm_{1-x}Ln_xS$ is used (where Ln is one of lanthanides which are trivalent in monosulfide: La, Ce, Pr, Nd, Gd, Tb, Dy, Ho, Er, Tm, Lu, Y, where $0<x<0.3$) and this increases a degree of degeneracy of the semiconductor of n-type (which firm $Sm_{1-x}Ln_xS$ solution is). This leads to a decrease in the dependence of its resistance from temperature, and consequently, to a decrease of the TCR of a resistance strain gauge and to an increase in accuracy.

The inventors experimentally defined that at $x\geq0.3$ metal phase occurs in a semiconductor which leads to tensosensitivity.

However, the inventors also defined experimentally that when doping by elements, mentioned in the first option (La, Ce, Pr, Nd, Gd, Tb, Dy, Ho, Er, Tm, Lu, Y, where $0<x<0.3$), the resistance of R-resistance strain gauge decreases. This factor leads to a decrease in measurement accuracy.

In measuring circuits resistant strain gauges are switched on according to the Wheatstone bridge scheme. In this case an output signal is determined by the formula:

$$U_{output}=(n/4)K\in U_{input},$$

where "n" is a number of active bridge arms, K—gauge-factor, $\in$—value of relative deformation of resistance strain gauge, $U_{input}$—input voltage of a bridge. Thus to increase an output signal, $U_{input}$ should be maximum.

Power, which is generated on the resistance strain gauge (W), is connected with a supply voltage and the resistance of a resistant strain gauge by relation $W\sim U_{input}^2/R$. R-decrease leads to an increase of power which is produced on a resistant strain gauge, to its heating and change of R-value due to the presence of TCS. Therefore if TCS decreases together with R measurement accuracy decreases.

It might seem that effect of R decreasing effect can be eliminated by reducing the film thickness. However, as it was discovered by the inventors, this way is not appropriate for the materials on the basis on SmS. This is due to the fact that with decreasing of film thickness a decisive role in the electroconductivity process plays hopping, which is observed in near-surface layer of material film on the basis of SmS. This conductivity is due to the presence of two- and trivalent ions of rare-earth elements. Hopping shunts the usual semiconductor band conductivity and, hence, suppresses useful resistant strain gauges semiconductor properties of materials on the basis of SmS. This decreases the measurement accuracy.

To eliminate the mentioned disadvantage the inventors propose making a system of holes/opening (lengthen and slot are more expedient) elongated in the direction between the contact pads and preferably connecting them.

This system of hole/opening comprises at least one opening, preferably several openings having an elongated area and extending at least partially between the contacts, preferably extending over the entire distance between the contact.

This increases the resistance of resistant strain gauges (without changes in the direction of the current line) and leads to higher accuracy. Implementation of the holes of another form is technologically inexpedient. The width and number, in particular also the length of the holes can be chosen taking into account an area of the film.

As the inventors found out, by the second option at doping of samarium sulfide SmS by samarium excess ions of samarium are in trivalent state, each of them gives the excess electron to the conduction band, which leads to a decrease in TCR of the film and resistant strain gauge and to an increase in accuracy. z value is restricted by 0.17, because at such value the area of homogeneity of the SmS ends, meaning that at such size the area of homogeneity of the SmS comes to an end and at further increase in z excess samarium is released in the form of individual metallic inclusions. Such inclusions of different configurations shunt a semiconductor material of sensing element of resistant strain gauge and decrease its useful semiconducting properties, in particular, the value of R.

As the inventors found out, by the second option at doping by excess samarium sulfide the resistance of resistant strain gauge also decreases. This factor leads to a decrease in accuracy of measurements, therefore by the second option as well as by the first one, the inventors suggest making a system of lengthened (slot) holes elongated in the direction between the contact pads and connecting them, in particular this means that the holes preferably extent over the entire distance between the contact pads. This embodiment increases the resistance of resistant strain gauges and leads to an increase in accuracy of measurements.

An additional positive effect of application of such form of resistant strain gauges is the ability to reduce the variation of electrical resistance strain gauge in a batch. It can be achieved by the fact that, after the resistant strain gauge installation one or more bridges, occurring as a result of the application of the elongated holes system, can be cut by an operator. It not only increases resistance, but also reduces the spread of resistance of resistant strain gauges in the batch, i.e. increases the reproducibility and accuracy.

BRIEF DESCRIPTION OF THE DRAWING

The sole FIGURE of the appended drawing shows a suggested resistant strain gauge schematically.

SPECIFIC DESCRIPTION OF THE DRAWING

The drawing shows:
1 strain-sensing layer;
2 substrate;
3 contact pads;
4 output wires;
5 holes/openings in strain-sensing layer (film).

Sputtering of the films 1 of above mentioned solid solutions by two options of the invention can be carried out, for example, by evaporation of bulk samples of the required composition and sputtering of them on a heated substrate 2 through a mask having a lattice form, specifying the width and number of elongated holes 5 in the strain-sensing layer.

Resistance strain gauges (options) work as follows.

Strain gauges are either glued or welded to the surface of a tested object or to the surface of a spring element of mechanical quantity sensors. They can be also placed inside a deformable medium. Under the influence of deformation of the surface or the medium the substrate of the strain gauge is also deformed. The semiconductor layer consisting of the proposed structure is deformed due to substrate deformation. Its resistance changes in direct proportion to the value of the deformation. This electrical resistance change is recorded by a calibrated electronic equipment.

Example 1

According to the first option eight polycrystalline films were sputtered on a glass substrate in particular using flash evaporation method. Compositions of films were $Sm_{1-x}Gd_xS$ and $Sm_{1-x}Lu_xS$. Masks were used during the sputtering process. Usage of masks allows getting the strain gauges' configuration from precipitated vapor. Four films were deposited using an ordinary mask. Another four films were deposited using a mask with openings on the place of strain-sensing layer. It allowed obtaining strain gauges with new proposed configuration. (FIGURE) After deposition of the films through another system of masks contacts of cobalt 3 were sputtered by resistive evaporation. Conditions of films deposition were similar: the substrate temperature is 460° C., the temperature of the boat ~2500° C., vacuum $10^{-6}$ mm Hg. Two powders $Sm_{1-x}Gd_xS$ with the values of x=0.1 and x=0.2 were sputtered. They were obtained by milling of bulk samples. Powder $Sm_{1-x}Lu_xS$ with the value of x=0.1 and x=0.2 was sputtered by the same way. The compositions of bulk samples were controlled by means of X-ray fluorescence analysis. The compositions of films were controlled the same way. Method's accuracy was ~10%.

Table 1 shows the parameters of the obtained thin films-parameters of manufactured strain gauges with the strain-sensing element made of compositions $Sm_{1-x}Gd_xS$ and $Sm_{1-x}Lu_xS$. The temperature coefficient of resistance was measured according to National State Standard 21616-91. The gauge factor was measured by gluing the sample on steel calibration beam—according to National State Standard 21616-91.

Table 1 shows the data for prototype which was sputtered under the same conditions. The decrease of TCR is observed because of doping by Gd; and Lu is approximately two times more compared with the pure SmS. Their strain sensitivity is reduced by 14-26%. As the accuracy of measurements ceteris paribus is directly proportional to K and inversely proportional to the TCR the result corresponds to the problem which is solved by the proposed invention and improves the accuracy of measurements.

As one can see, the resistance of doped strain gauges $R_{doped}$ which have proposed configuration is approximately two times more than $R_{blind}$ of strain gauges with the prototype's configuration. It corresponds to the problem to be solved by the proposed invention—improving the accuracy of measurements. Whereas all other prototype's configuration parameters and proposed configuration are the same.

Example 2

It is similar to Example 1. However, films 1 were produced with compositions $Sm_{0.6}Gd_{0.4}S$ and $Sm_{0.6}Lu_{0.4}S$, so x≥0.3. They had the gauge factor K≈4 and the TCR about $-10^{-4}$ $deg^{-1}$. We have a decrease of TCR however the value of K strongly decreases, which is not acceptable.

Example 3

According to the second option six polycrystalline films 1 of $Sm_{1+z}S$ were sputtered in vacuum by flash evaporation method on glass substrate 2. Three films were deposited using an ordinary mask. (Their configuration was similar to prototype). Another three films were deposited using a mask with openings on the place of strain-sensing layer. It allowed to obtain a strain gauge with new proposed configuration (Fig.). Conditions of films deposition were similar: the substrate temperature is 460° C., the temperature of the boat ~2500° C., vacuum $10^{-6}$ mm Hg. The difference was only in the composition of the powder of sputtering batch mixture. It had values of z which equaled to 0.05; 0.10 and 0.15. Strain gauges were set of produced films. Temperature coefficient of resistance strain gauges was determined in unglued state. Gauge factor was measured by gluing the sample on calibration beam made of steel. Parameters of produced strain gauges with the composition of sensing element $Sm_{1+z}S$ are shown in Table 2.

By adding excess of samarium comparing with the stoichiometric composition the value of TCR decreases in comparison with TCR of a pure SmS strain gauge in 1.7-2.9 times (see Table 1). A decrease of the strain sensitivity by 14-23% is observed. As the accuracy of measurements ceteris paribus is directly proportional to K and inversely proportional to the TCR the result corresponds to the problem which is solved by the proposed utility model—improving the accuracy of measurements.

As can be seen, the resistance strain gauges with the proposed configuration are approximately 2 times higher than the strain with the configuration of the prototype. This corresponds to the problem to be solved by the proposed invention—improving the accuracy of measurements. At the same time all other configuration parameters of the prototype and the proposed configuration are the same.

Example 4

It is similar to Example 3. However, there was produced a thin-film sample with excess of samarium in batch mixture corresponding to z=0.20. So z was more than in the formula of utility model 0.17. Table 2 shows the parameters of samples which were produced this way. We have a decrease of TCR together with a strong decrease of K value. This is unacceptable.

Example 5

Sixteen polycrystalline thin-film strain gauges were sputtered on glass substrate using the method of flash evaporation in vacuum. They were sputtered through the mask of appropriate configuration. Their sensitive element was a grid which consisted of four parallel stripes of polycrystalline semiconductor film. Film's composition was $Sm_{0.8}Gd_{0.2}S$. Sputtering regimes were similar to Example 1 Table 3 shows the resistance of produced strain gauges. Then we used the additional opportunities provided by the proposed configuration of the strain gauge, in order to increase the electrical resistance and reduce the scatter of R in the party of strain gauges. Some of the bridges were cut using the microscope by scalpel. Table 3 shows the number of cut bridges for each resistance strain gauge and its resistance after that. Initial resistances had a scatter from 74 to 625.4 Ohm (8.5 times). Final resistances were from 296 to 625.4 Ohm. That is twice less. Thus, a significant decrease in scatter of R, which increases an accuracy and reproducibility of measurements. Resistance of strain gauges increased. Initial average resistance was 297 Ohm. Final the average resistance was 492 Ohm. This reduces the power allocated on strain gauges, according to the relation $W=U^2/R$, in $(1/297)/(1/492)=1.7$ (while maintaining the voltage of the bridge), which also improves the measurement accuracy.

TABLE 1

| Composition | x | TCR, $10^{-3} deg^{-1}$ | K | $R_{blind}$, Ohm | $R_{proposed}$, Ohm |
|---|---|---|---|---|---|
| $Sm_{1-x}Gd_xS$ | 0.11 | −1.0 | 30 | 95 | 180 |
|  | 0.18 | −0.8 | 26 | 78 | 152 |
| $Sm_{1-x}Gd_xS$ | 0.09 | −1.0 | 31 | 98 | 190 |
|  | 0.22 | −0.8 | 28 | 70 | 145 |
| SmS | 0 | −2.0 | 35 | 202 | — |

TABLE 2

| z ($Sm_{1+z}S$) | TCR, $10^{-3} deg^{-1}$ | K | $R_{blind}$, Ohm | $R_{doped}$, Ohm |
|---|---|---|---|---|
| 0.05 | −1.2 | 30 | 120 | 231 |
| 0.10 | −0.9 | 28 | 105 | 203 |
| 0.15 | −0.7 | 27 | 91 | 174 |
| 0.20 | −0.1 | 5 | 30 | — |

TABLE 3

| Initial resistance, Ohm | The number of cut bridges | Final resistance, Ohm |
|---|---|---|
| 249.8 | 2 | 500 |
| 221.3 | 2 | 443 |
| 194.7 | 2 | 390 |
| 512.4 | 0 | 512.4 |
| 95 | 3 | 380 |
| 390.4 | 1 | 508 |
| 226.2 | 2 | 453 |
| 138 | 3 | 552 |
| 125.1 | 3 | 501 |
| 286.1 | 2 | 573 |
| 625.4 | 0 | 625.4 |
| 550.1 | 0 | 550.1 |
| 385.2 | 1 | 501 |
| 135.5 | 3 | 542 |
| 540.2 | 0 | 540.2 |
| 74 | 3 | 296 |

The invention claimed is:
1. A resistant strain gauge for measuring deformation and pressure comprising:
   a dielectric substrate;
   a polycrystalline strain-sensing layer deposited on the substrate and containing Samarium Sulphide;

metal contacts positioned on one side of the strain-sensing layer;

electrical wires connected to the contacts, the strain-sensing layer having openings extending from one contact to the other, the material of the strain-sensing layer being $Sm_{1-x}Ln_xS$, where $0<x<0.3$ and Ln is La, Ce, Pr, Nd, Gd, Tb, Dy, Ho, Er, Tm, Lu, or Y.

2. A resistant strain gauge for measuring deformation and pressure, the gauge comprising:

a dielectric substrate;

a polycrystalline strain-sensing layer containing Samarium Sulphide deposited on the substance;

metal contacts positioned on one side of the strain-sensing layer;

electrical wires being connected to the contacts, the strain-sensing layer having openings extending from one contact to to another, the material of the strain-sensing layer being $Sm_{1+z}S$, where $0<z<0.17$.

3. A method of manufacturing a resistant strain gauge by the steps of:

depositing a polycrystalline strain-sensing layer containing Samarium Sulphide on a dielectric substrate, depositing metal contacts at a spacing from one another on the same surface side of the strain-sensing layer and connecting wires to the contacts, providing at least one opening in the strain-sensing layer extending at least partially over the entire spacing between the contacts, the strain-sensing layer either being $Sm_{1-x}Ln_xS$, where $0<x<0.3$ and Ln being La, Ce, Pr, Nd, Gd, Tb, Dy, Ho, Er, Tm, Lu, Y or $Sm_{1+z}S$, where $0<z<0.17$.

4. The method according to claim 3, wherein the openings are formed by sputtering the composition of the strain-sensitive layer to the dielectric substrate through a mask or by cutting out or etching the openings after depositing the layer.

* * * * *